(12) United States Patent
Chu

(10) Patent No.: US 8,732,552 B2
(45) Date of Patent: May 20, 2014

(54) BLOCK MANAGEMENT METHOD, MEMORY CONTROLLER AND MEMORY STORAGE DEVICE THEREOF

(75) Inventor: Chien-Hua Chu, Hsinchu County (TW)

(73) Assignee: Phison Electronics Corp., Miaoli (TW)

( * ) Notice: Subject to any disclaimer, the term of this patent is extended or adjusted under 35 U.S.C. 154(b) by 203 days.

(21) Appl. No.: 13/365,270

(22) Filed: Feb. 3, 2012

(65) Prior Publication Data

US 2013/0111301 A1 May 2, 2013

(30) Foreign Application Priority Data

Nov. 2, 2011 (TW) .............................. 100140030 A

(51) Int. Cl.
*G11C 29/00* (2006.01)
(52) U.S. Cl.
USPC ............................ 714/766; 714/723; 714/724

(58) Field of Classification Search
USPC ......................................... 714/723, 724, 766
See application file for complete search history.

(56) References Cited

U.S. PATENT DOCUMENTS

| 2009/0070654 A1* | 3/2009 | Flachs et al. .................. 714/758 |
| 2013/0124932 A1* | 5/2013 | Schuh et al. .................. 714/718 |

* cited by examiner

*Primary Examiner* — Guy Lamarre
(74) *Attorney, Agent, or Firm* — Jianq Chyun IP Office

(57) ABSTRACT

A block management method for managing physical blocks of a rewritable non-volatile memory module, and a memory controller and a memory storage device using the same are provided. The method includes maintaining an error information table for recording one or more error correctable physical blocks among the physical blocks and an error bit number corresponding to the one or more error correctable physical blocks. The method further includes selecting a physical block for writing data according to the one or more error correctable physical blocks and the error bit number thereof recorded in the error information table. Accordingly, the data stability of the memory storage device can be improved.

23 Claims, 7 Drawing Sheets

BLOCK MANAGEMENT METHOD, MEMORY CONTROLLER AND MEMORY STORAGE DEVICE THEREOF

CROSS-REFERENCE TO RELATED APPLICATION

This application claims the priority benefit of Taiwan application serial no. 100140030, filed on Nov. 2, 2011. The entirety of the above-mentioned patent application is hereby incorporated by reference herein and made a part of this specification.

BACKGROUND

1. Technology Field

The invention relates to a block management method. More particularly, the invention relates to a method for managing physical blocks of a rewritable non-volatile memory module, and a memory controller as well as a memory storage device using such method.

2. Description of Related Art

The characteristics of rewritable non-volatile memory include data non-volatility, low power consumption, small volume, and non-mechanical structure, etc; thus, the rewritable non-volatile memory is broadly applied to varied electronic devices. The rewritable non-volatile memory includes a plurality of physical blocks, and each of the physical blocks has a plurality of physical pages. Particularly, each physical block is the smallest erasing unit, and each physical page is the smallest programming (i.e., writing) unit.

When a storage device using the rewritable non-volatile memory (hereinafter "memory storage device") is manufactured and formatted for the first time (i.e. the pre-formatting operation), the memory controller of the memory storage device conducts a disk scan among all the physical blocks of the rewritable non-volatile memory to identify normal physical blocks and damaged physical blocks. The normal physical blocks have priority for being grouped into the data area and the spare area by the memory controller, and the remaining physical blocks will be grouped into the replacement area. The physical blocks in the data area are used for storing data from the host system, the physical blocks in the spare area are used for alternating the physical blocks in the data area, and the physical blocks in the replacement area is used to replace the physical block damaged during the operation of the memory storage device.

Generally speaking, even normal physical blocks have different lifespan. Therefore, in the process of using the memory storage device, if the lifespan differences between the physical blocks are too huge, situation like data instability will easily arise.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

Accordingly, the present invention provides a block management method, a memory controller and a memory storage device for reducing the situation of data instability due to the excessive lifespan difference between the physical blocks in the rewritable non-volatile memory module.

The present invention provides a block management method for managing a plurality of physical blocks of a rewritable non-volatile memory module. The block management method includes maintaining an error information table to record at least one error correctable physical block among the physical blocks. The error information table also records an error bit number corresponding to the at least one error correctable physical block. The block management method also includes selecting a physical block for writing data according to the at least one error correctable physical block and the error bit number corresponding thereto recorded in the error information table.

According to another exemplary embodiment of the present invention, a memory controller for managing the rewritable non-volatile memory module of the memory storage device is provided. The memory controller includes a host system interface, a memory interface, and a memory management circuit. The host system interface is configured to be coupled to the host system. The memory interface is configured to be coupled to the rewritable non-volatile memory module. The rewritable non-volatile memory module includes a plurality of physical blocks. The memory management circuit is coupled to the host system interface and the memory interface. The memory management circuit is configured to maintain an error information table to record at least one error correctable physical block among the physical blocks and an error bit number corresponding to the at least one error correctable physical block. Further, the memory management circuit is configured to select a physical block for writing data according to the at least one error correctable physical block and the error bit number corresponding thereto recorded in the error information table.

According to another exemplary embodiment of the present invention, a memory storage device, including a rewritable non-volatile memory module, a connector, and a memory controller, is provided. The rewritable non-volatile memory module includes a plurality of physical blocks. The connector is configured to be coupled to a host system. The memory controller is coupled to the rewritable non-volatile memory module and the connector. The memory controller is configured to maintain an error information table to record at least one error correctable physical block among the aforementioned physical blocks and an error bit number corresponding to the at least one error correctable physical block. Further, the memory controller is configured to select a physical blocks for writing data according to the at least one error correctable physical block and the error bit number corresponding thereto recorded in the error information table.

Based on the above, the present invention manages the physical blocks based on whether each physical block passes a writing test and an erasing test, and the error bit number of such physical block. In further detail, the present invention determines whether to use such physical block to write data, according to the error bit number of the physical block. Therefore, the lifespan of the physical blocks in the rewriteable non-volatile memory module are more equalized, and thus the stability of the data can be increased.

It should be understood, however, that this summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
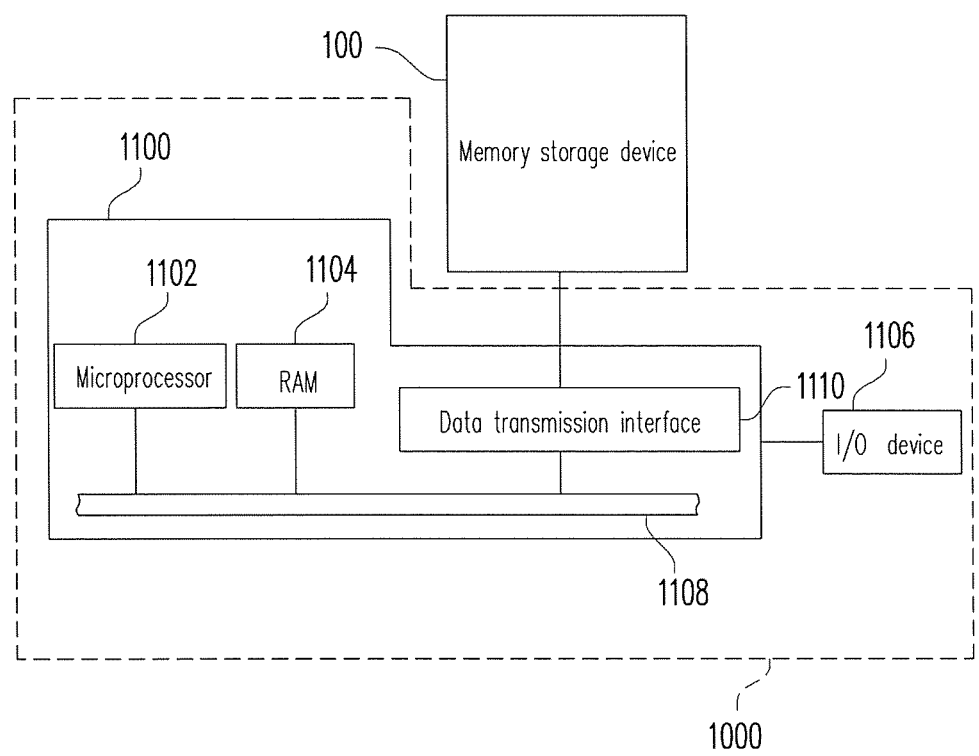
FIG. 1A is a schematic diagram of a host system using a memory storage device according to an exemplary embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

A memory storage device (i.e., a memory storage system) typically includes a rewriteable non-volatile memory module and a controller (i.e., a control circuit). The memory storage device is usually used together with a host system so that the host system can write data into or read data from the memory storage device. In addition, a memory storage device may include an embedded memory and a software that can be executed by a host system and substantially served as a controller of the embedded memory. Generally speaking, when a memory storage device leaves the factory, the rewriteable non-volatile memory module includes normal physical blocks and damaged physical blocks, whereas every normal physical block has different lifespan depending on the error rate during a data reading process. According to the above, the present invention provides a block management method, a memory controller, and a memory storage device, for increasing data accuracy by averaging the lifespan of the physical blocks.

FIG. 1A is a schematic diagram of a host system using a memory storage device according to an exemplary embodiment of the present invention.

Figure 1B:
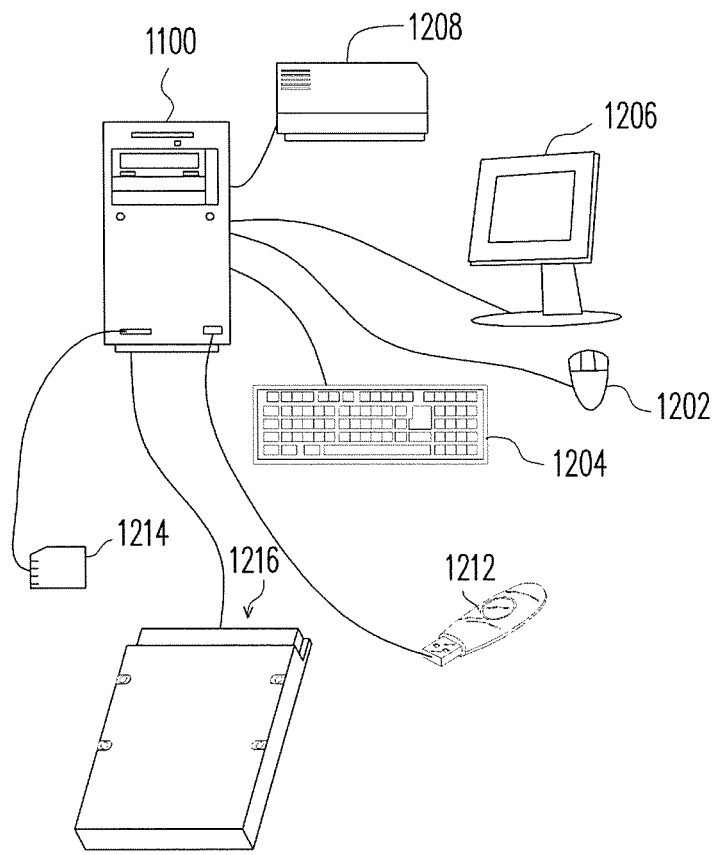
FIG. 1B illustrates a computer, an input/output (I/O) device, and a memory storage device according to an exemplary embodiment of the present invention.

A host system 1000 includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206, and a printer 1208, as shown in FIG. 1B. It should be understood that, the devices depicted in FIG. 1B should not be construed as limitations to the present invention. The I/O device 1106 may include other devices as well.

In an exemplary embodiment of the present invention, the memory storage device 100 is coupled to other components of the host system 1000 through the data transmission interface 1110. By the operation of the microprocessor 1102, the RAM 1104, and the I/O device 1106, the host system 1000 may write data into the memory storage device 100 or read data from the memory storage device 100. For example, the memory storage device 100 may be a flash drive 1212, a memory card 1214 or a solid state drive (SSD) 1216, as shown in FIG. 1B.

Figure 1C:
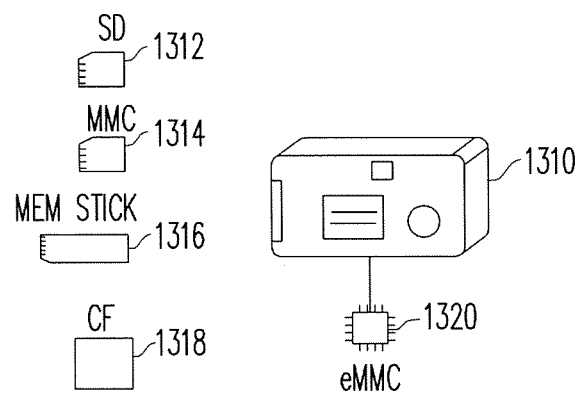
FIG. 1C schematically illustrates a host system and a memory storage device according to another exemplary embodiment of the present invention.

Generally speaking, the host system 1000 may be any system that is able to store data. Even though the host system 1000 is described as a computer system in the present exemplary embodiment, in another exemplary embodiment of the invention, the host system 1000 may also be a cell phone, a digital camera, a video camera, a communication device, an audio player, or a video player, and etc. For example, when the host system is a digital camera 1310, the storage device may be a secure digital (SD) card 1312, a multimedia card (MMC) 1314, a memory stick 1316, a compact flash (CF) card 1318, or an embedded storage device 1320, used by the digital camera 1310, as shown in FIG. 1C. The embedded storage device 1320 includes an embedded MMC (eMMC). It should be mentioned that the eMMC is directly coupled to the substrate of the host system.

Figure 2:
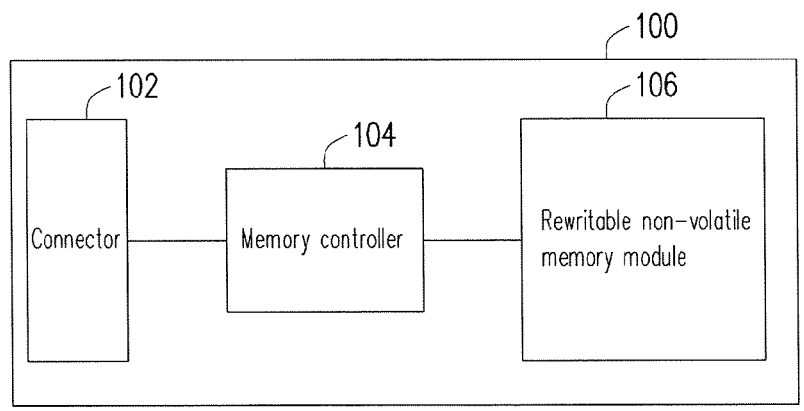
FIG. 2 is a schematic block diagram illustrating the memory storage device depicted in FIG. 1A.

FIG. 2 is a schematic block diagram of the memory storage device depicted in FIG. 1A. With reference to FIG. 2, the memory storage device 100 includes a connector 102, a memory controller 104, and a rewritable non-volatile memory module 106.

The connector 102 is coupled to the memory controller 104 and configured for coupling to the host system 1000. In the present exemplary embodiment, a kind of transmission interface supported by the connector 102 my be a Serial Advanced Technology Attachment (SATA) interface. However, in another exemplary embodiment, the types of the transmission interface of the connector 102 may be a Universal Serial Bus (USB) interface, a MMC interface, a parallel advanced technology attachment (PATA) interface, an Institute of Electrical and Electronic Engineers (IEEE) 1394 interface, a peripheral component interconnect express (PCI-E) interface, a SD interface, a memory stick (MS) interface, a compact flash (CF) interface, an integrated drive electronics (IDE) interface, or any suitable interface which is not limited to the above selection.

The memory controller 104 executes a plurality of logic gates or control instructions implemented in a hardware form or a firmware form, and the memory controller 106 performs various data operations such as data writing, reading, and erasing in the rewritable non-volatile memory module 106 according to the host commands from the host system 1000. Particularly, the memory controller 104 determines whether to use certain physical blocks in the rewritable non-volatile memory module 106 according to the error bit number thereof, which is disclosed in the block management method in this exemplary embodiment. The block management method of the present exemplary embodiment is described later with reference to the accompanying drawings.

The memory controller 104 is coupled to the connector and the rewritable non-volatile memory module 106. The rewritable non-volatile memory module 106 includes a plurality of physical blocks. Each of the physical block has a plurality of physical pages. For example, the rewritable non-volatile memory module 106 may be a multi level cell (MLC) NAND flash memory module, although the invention is not limited thereto. The rewritable non-volatile memory module 106 may also be single level cell (SLC) NAND flash memory module, other flash memory module, or any other memory module having the same characteristics.

Figure 3:
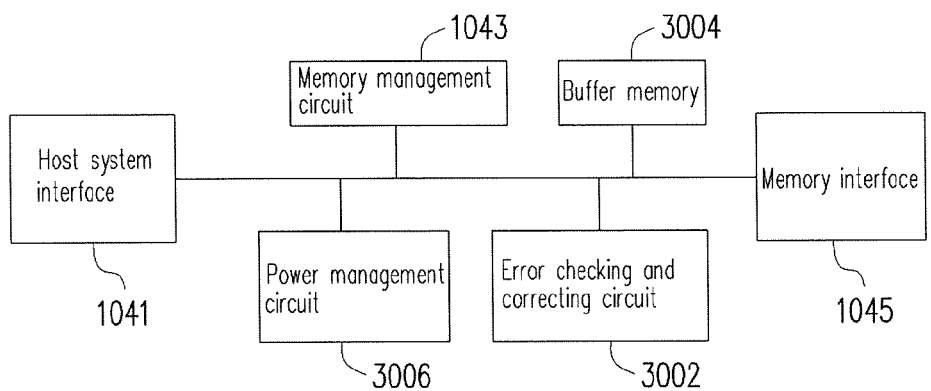
FIG. 3 is a schematic block diagram of a memory controller according to an exemplary embodiment of the present invention.

FIG. 3 is a schematic block diagram of a memory controller according to an exemplary embodiment of the present invention. Referring FIG. 3, the memory controller 104 includes a host system interface 1041, a memory management circuit 1043 and a memory interface 1045.

The host system interface 1041 is coupled to the memory management circuit 1043 and configured for coupling to the host system 1000 via the connector 102. The host system interface 1041 is used to receive and identify the commands and data transmitted from the host system 1000. Accordingly, the commands and data from the host system 1000 are transmitted to the memory management circuit 1043 via the host system interface 1041. According to the present embodiment, the connector corresponding to the host system interface 1041 is a SATA interface. However, in other exemplarily embodiments, the host system interface 1041 may also be a USB interface, a MMC interface, a PATA interface, an IEEE 1394 interface, a PCI Express interface, a SD interface, a MS interface, a CF interface, an IDE interface, or other standardized interfaces.

The memory management circuit 1043 is configured for controlling the overall operation of the memory controller 104. To be specific, the memory management circuit 1043 has a plurality of control instructions, and the control instructions are executed to implement the block management method in the present invention, when the memory storage device 100 is in operation.

In an exemplary embodiment, the control commands of the memory management circuit 1043 are implemented in a firmware form. For example, the memory management circuit 1043 has a microprocessor unit (not shown) and a read-only memory (not shown), and these control instructions are burned into the read-only memory. When the memory storage device 100 is enabled, the aforementioned control instructions are executed by the micro-processor unit to accomplish the block management method according to this exemplary embodiment.

In another exemplary embodiment of the invention, the control instructions of the memory management circuit 1043 may also be stored in a specific area of the rewritable non-volatile memory module 106 (for example, a system area exclusively used for storing system data in the rewritable non-volatile memory module 106) as program codes. Additionally, the memory management circuit 1043 may have a microprocessor unit (not shown), a read-only memory (not shown) and a random access memory (not shown). In particular, the ROM has boot codes, and when the memory controller 104 is enabled, the microprocessor unit first executes the boot codes to load the control instructions from the rewritable non-volatile memory module 106 into the RAM of the memory management circuit 1043. Then, the microprocessor unit runs these control instructions to execute the block management method according to this exemplary embodiment. Additionally, the control commands of the memory management circuit 1043 may also be implemented in a hardware form according to another exemplary embodiment of the present invention.

The memory interface 1045 is coupled to the memory management circuit 1043 and configured for coupling the memory controller 104 to the rewritable non-volatile memory module 106. Accordingly, the memory controller 104 may execute related operations to the rewritable non-volatile memory module 106. Namely, data to be written into the rewritable non-volatile memory module 106 is converted by the memory interface 1045 to a format acceptable to the rewritable non-volatile memory module 106.

In another exemplary embodiment of the present invention, the memory controller 104 still includes an error checking and correcting circuit 3002. The error checking and correcting circuit 3002 is coupled to the memory management circuit 1043 and configured for executing an error checking and correcting procedure to ensure data accuracy. To be specific, when the memory management circuit 1043 receives a write command from the host system 1000, the error checking and correcting circuit 3002 generates an error checking and correcting (ECC) code for data corresponding to the write command, and the memory management circuit 1043 writes the data corresponding to the write command and the corresponding ECC code into the rewritable non-volatile memory module 106. Subsequently, when the memory management circuit 1043 reads the data from the rewritable non-volatile memory module 106, the memory management circuit 1043 simultaneously reads the corresponding ECC code, and the error checking and correcting circuit 3002 executes the ECC procedure to the read data based on the corresponding ECC code, to determine whether the data has an error bit.

In another exemplary embodiment of the present invention, the memory controller 104 still includes a buffer memory 3004. The buffer memory 3004 may be a static random access memory (SRAM) or dynamic random access memory (DRAM), although the invention is not limited thereto. The buffer memory 3004 is coupled to the memory management circuit 1043 and configured to temporarily store data received from the host system 1000 or data received from the rewritable non-volatile memory module 106.

In another exemplary embodiment of the present invention, the memory controller 104 still includes a power management circuit 3006. The power management circuit 3006 is coupled to the memory management circuit 1043 and configured for controlling the power of the memory storage device 100.

Figure 4:
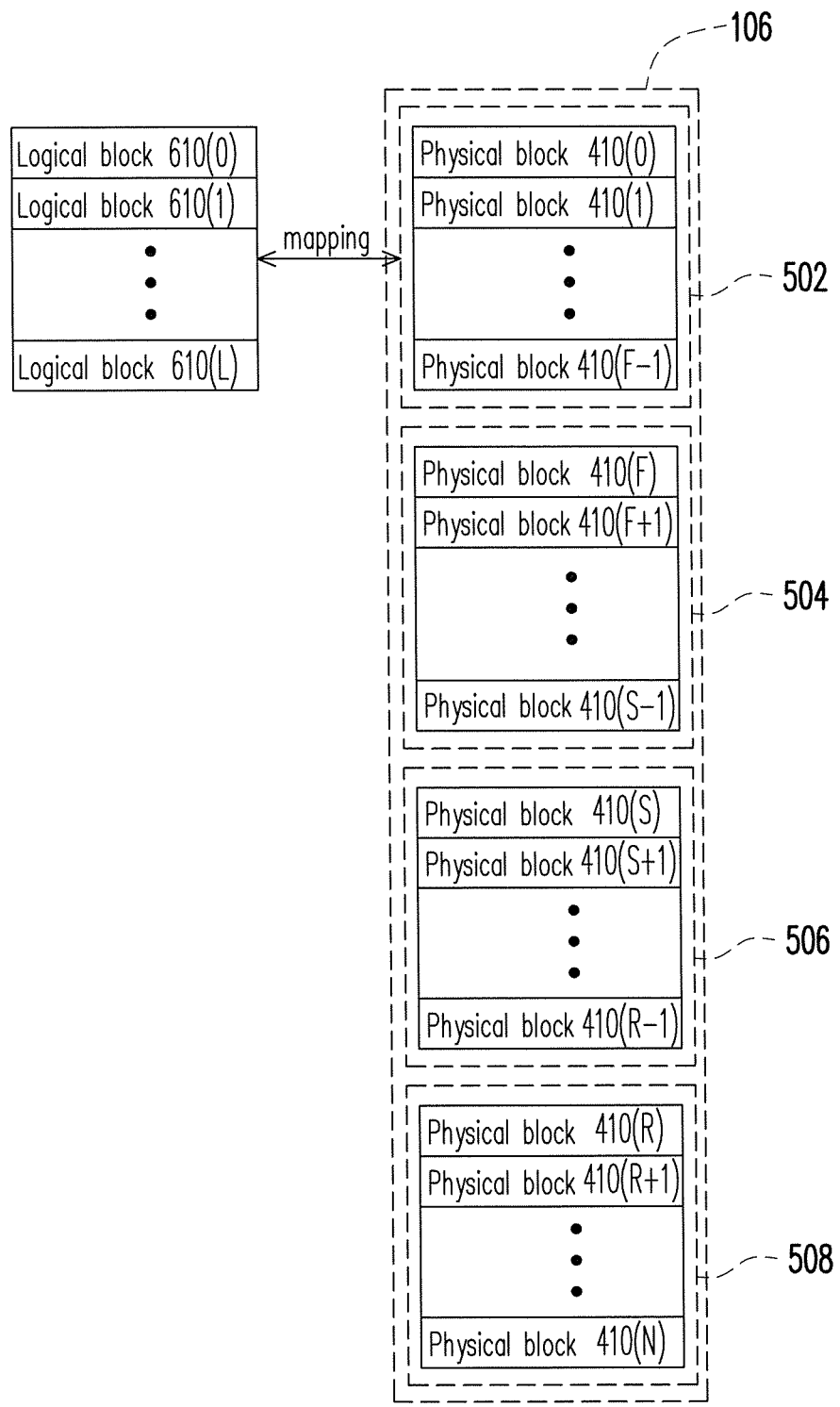
FIG. 4 is a schematic diagram of managing physical blocks according to an exemplary embodiment of the present invention.

FIG. 4 is a schematic diagram of managing the physical block of a rewritable non-volatile memory module according to an exemplary embodiment of the present invention.

Referring to FIG. 4, the rewritable non-volatile memory module 106 in this exemplary embodiment includes physical blocks 410(0)~410(N). Each of the physical block has a plurality of physical pages. The memory management circuit 1043 in the memory controller 104 logically groups the physical blocks 410(0)~410(N) into a data area 502, a spare area 504, a system area 506, and a replacement area 508. In particular, the F, S, R and N indicated in FIG. 4 are positive integers which represent the numbers of the physical blocks allocated in each area, and may be configured based on a capacity of the rewritable non-volatile memory module 106 used by the manufacturer of the memory storage device 100.

The physical blocks logically belonging to the data area 502 and the spare area 504 are used for storing data from the host system 1000. To be specific, the physical blocks of the data area 502 are the physical blocks which have been used for storing data, and the physical blocks of the spare area 504 are the physical blocks which are used for writing new data. In other words, the physical blocks in the spare area 504 are either blank physical blocks or usable physical blocks (i.e., these physical blocks do not contain data, or these physical blocks contain data marked as invalid data). When a write command and a data to be written are received from the host system 1000, the memory management circuit 1043 selects a physical block from the spare area 504 and writes the data into the selected physical block to substitute the physical block of the data area 502. In addition, when a data merging procedure is to be executed on a specific logical block, the memory management circuit 1043 selects a physical block from the spare area 504 and writes data into the selected physical block to substitute the physical block previously mapped to the logical block.

The physical blocks logically belonging to the system area 506 are used for recording system data. For example, the system data includes the manufacturers and models of the rewritable non-volatile memory module 106, the number of physical blocks in the rewritable non-volatile memory modules 106, the number of physical pages in each physical block, and so on.

The physical blocks logically belonging to the replacement area 508 are used in a damaged physical block replacement procedure for replacing damaged physical blocks in the data area 502, the spare area 504, or the system area 506. Particularly, during the operation of the memory storage device 100, if there are still normal physical blocks in the replacement area 508, and a physical block in the data area 502 is damaged, the memory management circuit 1043 selects a normal physical block from the replacement area 508 to replace the damaged physical block in the data area 502. Based on the above, during the operation of the memory storage device 100, the physical blocks associated with the data area 502, the spare area 504, the system area 506, and the replacement area 508 are dynamically changed. For instance, the physical blocks used for alternatively storing data are dynamically associated with the data area 502 or the spare area 504.

To enable the host system 1000 to access the rewriteable non-volatile memory module 106, the memory management circuit will allocate a plurality of logical blocks 610(0)~610(L) to map the physical blocks 410(0)~410(F-1) in the data area 502. Each logical block includes a plurality of logical pages, and the logical pages of the logical blocks 610(0)~610(L) sequentially map to the physical pages of the physical blocks 410(0)~410(F-1).

In detail, the memory management circuit 1043 provides the allocated logical blocks 610(0)~610(L) to the host system 1000, and maintains a logical block-physical block mapping table to record the mapping relationship between the logical blocks 610(0)~610(L) and the physical blocks 410(0)~410(F-1). Therefore, when the host system 1000 is about to access a specific logical access address, the memory management circuit 1043 converts such logical access address into a logical page of the corresponding logical block, and accesses data on the mapped physical page according to the logical block-physical block mapping table.

In this exemplary embodiment, when the memory storage device 100 is manufactured and thus to be formatted for the first time (i.e., the pre-formatting operation), the memory management circuit 1043 in the memory controller 104 executes a writing test, an erasing test and a reading test to all the physical blocks in the rewritable non-volatile memory modules 106. Regarding all the physical blocks that pass the writing test and the erasing test, if the number of error bits generated by the reading test is smaller than or equal to a threshold, the corresponding physical block will be identified as an error correctable physical block by the memory management circuit 1043 (that is, the error bit thereof may be corrected by the error checking and correcting circuit 3002). Generally speaking, during the pre-formatting operation, the memory management circuit 1043 first groups the error correctable physical blocks to the data area 502 and the spare area 504. The value of the threshold for determining the error correctable physical block is dependent on the specification of the rewritable non-volatile memory module 106. For example, if the threshold is 48, the error checking and correcting circuit 3002 has the capability to check and correct 48 error bits. That is, if the read data has more than 48 error bits, such data cannot be corrected by the error checking and correcting circuit 3002. However, it is to be understood that the present invention does not limit the value of the threshold.

Besides, the memory management circuit 1043 will identify some physical blocks as error uncorrectable physical blocks. Examples of such physical blocks include: any physical block that passes the writing test and the erasing test, but the number of its error bit generated by the reading test is larger than the threshold; as well as any physical block that fails to pass the writing test and/or the erasing test.

In this exemplary embodiment, the memory management circuit 1043 records the mapping relationship of each error correctable physical block and its error bit number in an error information table.

In another exemplary embodiment, the memory management circuit 1043 may execute only a writing test and a reading test to all the physical blocks in the rewriteable non-volatile memory module 106 to obtain error bit thereof, and accordingly establishes an error information table.

In yet another exemplary embodiment, the memory management circuit 1043 may establish the error information table by writing and reading data during the operation of the memory storage device 100.

Figures 5A, 5B:
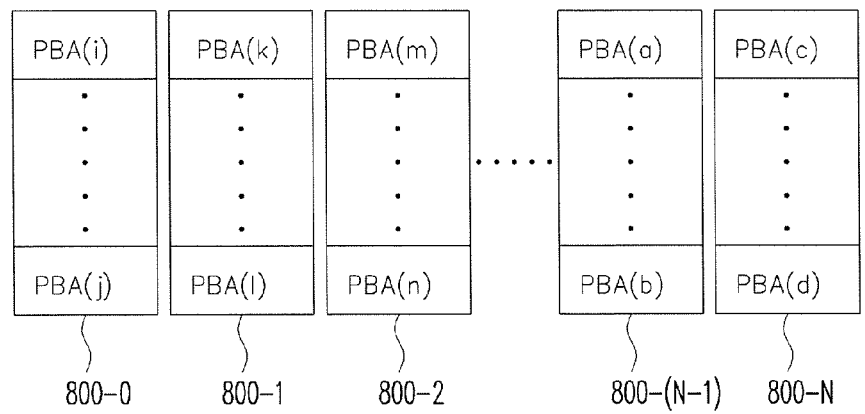
FIGS. 5A and 5B are diagrams illustrating the error information table according to an exemplary embodiment of the present invention.

FIG. 5A is a diagram illustrating the error information table according to an exemplary embodiment of the present invention. Referring to the error information table 700 in FIG. 5A, it is assumed that the threshold is 48, then the memory management circuit 1043 uses the error bit number of 0 to 48 as key value to establish 49 entries of the error information table. The 49 entries are used to respectively record the error bit number complying with the key value thereof, and the physical block address of each error correctable physical block having the error bit number complying with the key value of the entry. Besides, the memory management circuit 1043 creates another entry in the error information table 700 (represented as non-useable physical block entry hereafter), to record the physical block address of each error uncorrectable physical block. For example, referring to the error information table 700, the error correctable physical blocks with the physical block address of PBA(k) and PBA(l) have one error bit (i.e., the error bit number is 1). The error correctable physical blocks with the physical block address of PBA(a) and PBA(b) have 48 error bits (i.e., the error bit number is 48). Additionally, the physical blocks with the physical block address of PBA(c) and PBA(d) are error uncorrectable physical blocks.

FIG. 5B is a diagram illustrating the error information table according to another exemplary embodiment of the present invention. It is assumed that the value of the threshold is 48, the error information table 800 in FIG. 5B has 50 sub-tables (for example, sub-tables 800-0, 800-1, 800-2, 800-(N-1), and 800-N) to respectively record the physical block address of each error correctable physical block with the corresponding error bit number being 0~48, and the physical block address of each error uncorrectable physical block. In this exemplary embodiment, sub-table 800-0 is used to record all the physical block addresses of the error correctable physical blocks having zero error bit (for example, physical block address PBA(i), PBA(j)). Sub-table 800-1 is used to record all the physical block addresses of the error correctable physical blocks having one error bit (for example, physical block address PBA(k), PBA(l)). Moreover, sub-table 800-N is used to record all the physical block addresses of the error uncorrectable physical blocks (for example, physical block address PBA(c), PBA(d)).

It should be noted that FIGS. 5A and 5B are merely examples for illustration. The present invention does not limit how the memory management circuit 1043 implements the error information table. In addition, the physical blocks indicated in FIGS. 5A and 5B are merely for ease of explanation, and whether the corresponding physical block will actually be adjacent in the rewriteable non-volatile memory module 106 is irrelevant.

The memory management circuit 1043 stores the error information table, which is established for the first time after the pre-formatting operation, in a error correctable physical block of the rewriteable non-volatile memory module 106 (e.g., an error correctable physical block logically grouped into the system area 506). Thereafter, when the host system 1000 accesses the memory storage device 100, the memory management circuit 1043 reads the error information table from the system area 506 back to the buffer memory 3004, and utilizing the error information table to select, according to the error bit number of each error correctable physical block, one or more physical blocks for writing data. Basically, the memory management circuit 1043 more often uses the error correctable physical block that has less corresponding error bit number.

In further detail, when the memory storage device 100 is in operation, the memory management circuit 1043 will look up the error information table to obtain the error bit number of each error correctable physical block, and accordingly distribute all the error correctable physical blocks into multiple block queues. Each block queue respectively corresponds to a block utility rate, and a block queue that has less corresponding error bit number will have a higher block utility rate.

In an exemplary embodiment, the memory management circuit 1043 distribute all the error correctable physical blocks into multiple block queues directly according to the value of the error bit number of each error correctable physical block. For example, the memory management circuit 1043 distributes all the error correctable physical blocks having the corresponding error bit number of zero into the same block queue, and distributes all the error correctable physical blocks having the corresponding error bit number of one into the same block queue, and so on.

In another exemplary embodiment, the memory management circuit 1043 defines several error bit number intervals according to the maximum number of the error bit that the error checking and correcting circuit 3002 can correct (i.e., the threshold for determining the error correctable physical block). In addition, the memory management circuit 1043 distributes all the error correctable physical blocks having their corresponding error bit number belonging to the same error bit number interval into the same block queue. For example, if the threshold is 48, the memory management circuit 1043 in this exemplary embodiment will distribute all the error correctable physical blocks having the corresponding error bit number of zero to a first block queue. Further, all the error correctable physical blocks having the corresponding error bit number of 1 to 20 will be distributed to a second block queue. All the error correctable physical blocks having the corresponding error bit number of 21 to 40 will be distributed into a third block queue. All the error correctable physical blocks having the corresponding error bit number of 41 to 48 will be distributed into a fourth block queue.

It is to be noted that in the present invention, the number and the distribution rule of the block queue are not limited.

When data are to be written to the rewritable non-volatile memory module 106, the memory management circuit 1043 selects one of the block queues according to the block utility rate thereof and writes data into the error correctable physical block in the selected block queue. For example, it is assumed that the memory management circuit 1043 distributes all the error correctable physical blocks to four block queues (hereinafter, the first block queue, the second block queue, the third block queue, and the fourth block queue), and the corresponding utility rate of the four block queues are 70%, 15%, 10% and 5%. Thus, of a hundred data write operations, the memory management circuit 1043 obtains the error correctable physical block for writing data from the first block queue for seventy times, from the second block queue for fifteen times, from the third block queue for ten times, and from the fourth block queue for five times.

In another exemplary embodiment, in order to provide better data stability, the memory management circuit 1043 distributes only the error correctable physical block having its corresponding error bit number smaller than or equal to a predetermined value, among all the error correctable physical blocks, into several block queues. For example, if the predetermined value is 40 and the threshold for determining the error correctable physical block is 48, for all the error correctable physical blocks having their corresponding error bit number larger than 40, the memory management circuit 1043 will not distribute them into any block queue even if such error bit number does not exceed the maximum number of the error bit that the error checking and correcting circuit 3002 can correct. That is, when data need to be written into the rewritable non-volatile memory module 106, the memory management circuit 1043 will not use the error correctable physical blocks having corresponding error bit number larger than the predetermined value to write data. Accordingly, the error correctable physical blocks with higher error bit number may avoid having a sudden increase in the error bit and the error bit number exceed the threshold during the present data write.

It is to be noted that, during the process of using the rewritable non-volatile memory module 106, the memory management circuit 1043 dynamically updates the error information table according to the change of the error bit number corresponding to each error correctable physical block. That is, the memory management circuit 1043 makes the error information table reflect the current error bit number of each error correctable physical block. When an error bit number of an error correctable physical block becomes larger than the threshold, the memory management circuit 1043 re-identifies such error correctable physical block as an error uncorrectable physical block, and records the physical block address of the error uncorrectable physical block in the error information table (for example, in the non-useable physical block entry as in FIG. 5A, or the sub-table 800-N for recording non-useable physical block as in FIG. 5B).

When data in an used physical block is to be erased, the memory management circuit 1043 also determines, according to the error information table, whether to join such physical block to the block queue after such physical block is erased. To be specific, the memory management circuit 1043 looks up the error information table to obtain the error bit number of such physical block, and determines whether the physical block having such error bit number can be distributed into any block queue according to the distribution rule of the block queue. For example, it is assumed that the memory management circuit 1043 defines three block queues. The first block queue includes error correctable physical blocks with the error bit number of zero. The second block queue includes error correctable physical blocks with the error bit number of one to 20. The third block queue includes error correctable physical blocks with the error bit number of 21 to 40. If the error bit number of the physical block, which is about to execute an erase operation, obtained by looking up the error information table is 25, the memory management circuit 1043 will record such physical block in the third block queue after the data is erased. If the error bit number of such physical block obtained by looking up the error information table is 45, the physical block will not be added to any block queue after the data on such physical block is erased.

Figure 6:
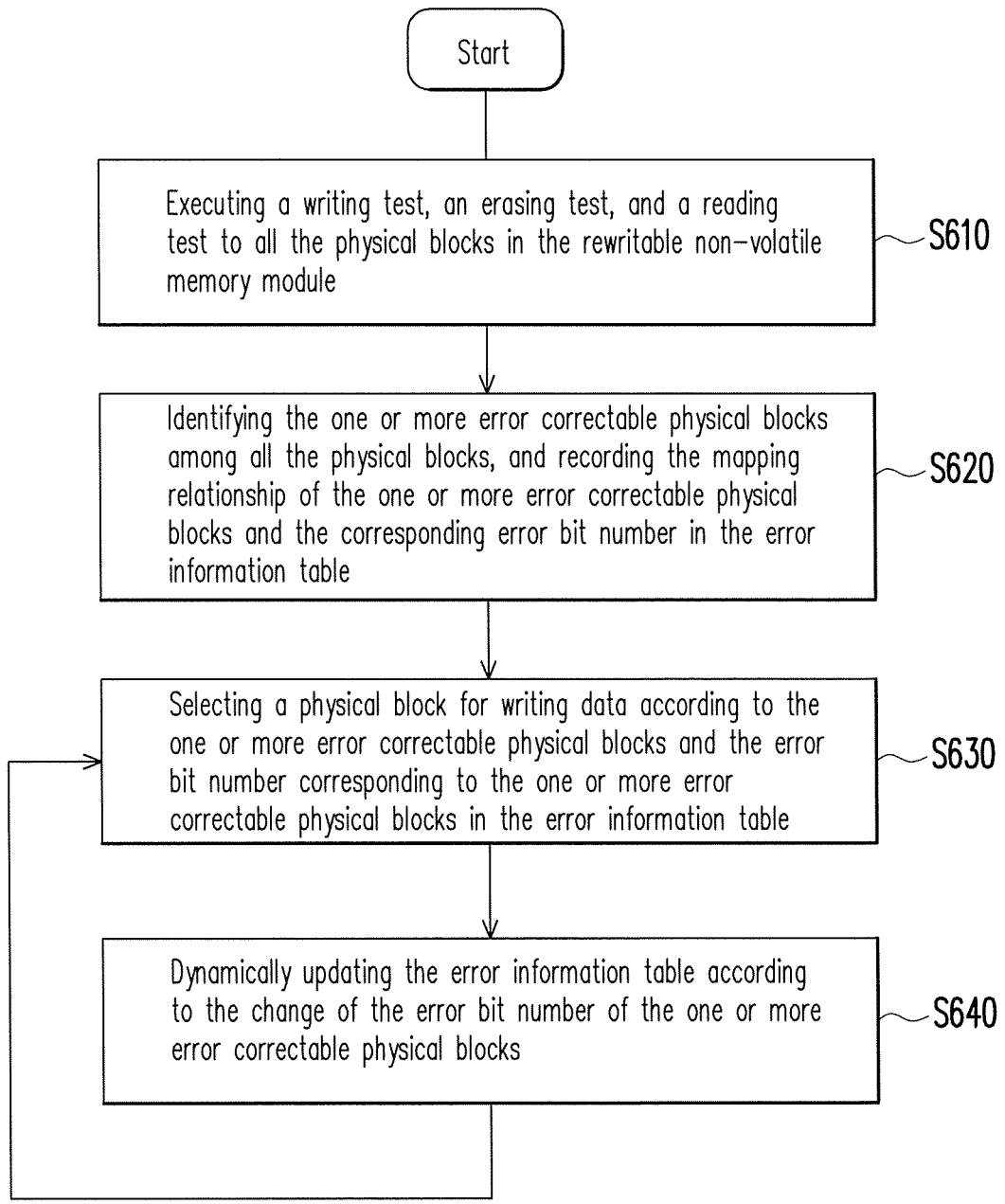
FIG. 6 is a flow chart illustrating a block management method according to an exemplary embodiment of the present invention.

FIG. 6 is a flow chart illustrating a block management method according to an exemplary embodiment of the present invention.

Referring to FIG. 6, when the memory storage device 100 is manufactured and undergoing the pre-formatting operation, as shown in step S610, first, the memory management circuit 1043 in the memory controller 104 executes a writing test, an erasing test and a reading test to all the physical blocks in the rewritable non-volatile memory modules 106.

Then, in step S620, the memory management circuit 1043 identifies one or more error correctable physical blocks among all the physical blocks, and records the mapping relationship of the one or more error correctable physical blocks and the corresponding error bit number in an error information table. Note that each error correctable physical block is a physical block that passes the writing test and the erasing test. Also, the number of the error bit generated by the reading test applied to such error correctable physical block is smaller than or equal to the threshold.

Then, as in step S630, the memory management circuit 1043 selects a physical block for writing data according to the one or more error correctable physical blocks and the corresponding error bit number thereof in the error information table. In this exemplary embodiment, a physical block having lower error bit number will have higher utility rate. Also, referring to step S640, the memory management circuit 1043 dynamically updates the error information table according to the change of the error bit number corresponding to the one or more correctable physical blocks.

When using the rewriteable non-volatile memory module 106, the memory management circuit 1043 repeatedly executes steps S630 and S640 to maintain the error information table to ensure that the error information table records is the present error bit number of each error correctable physical block. Further, the memory management circuit 1043 determines how to use the error correctable physical block according to the mapping relationship of the error correctable physical block and the error bit number recorded in the error information table.

Figure 7:
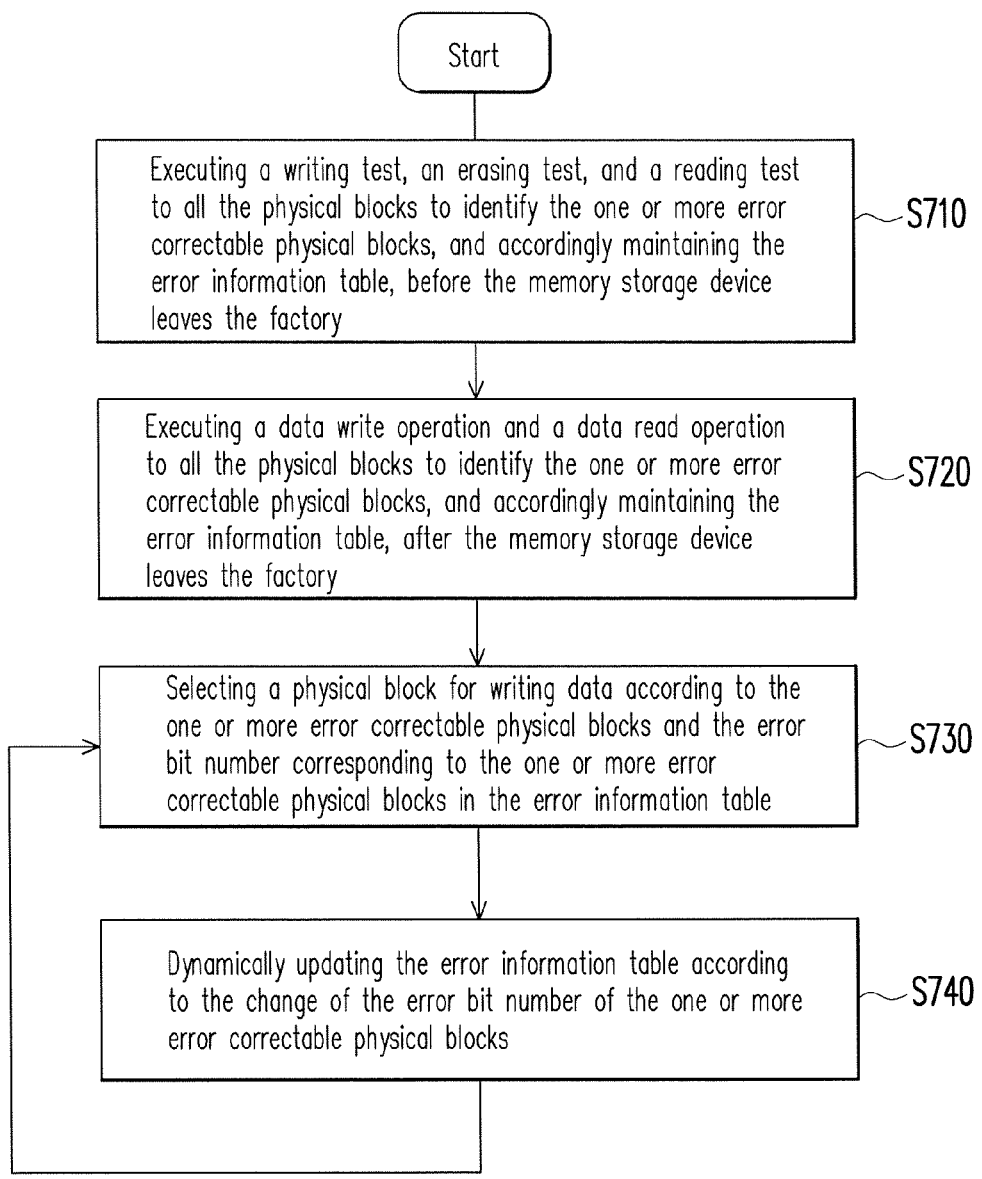
FIG. 7 is a flow chart illustrating a block management method according to another exemplary embodiment of the present invention.

FIG. 7 is a flow chart illustrating a block management method according to another exemplary embodiment of the present invention. In this exemplary embodiment, the memory management circuit 1043 may maintain an error information table by test operations performed before the memory storage device 100 leaves the factory. Moreover, the memory management circuit 1043 may establish the error information table by executing a data write operation and a data read operation during the operation of the memory storage device 100.

To be specific, when the memory storage device 100 is manufactured and before the memory storage device 100 leaves the factory, as in step S710, the memory management circuit 1043 executes a writing test, an erasing test and a reading test to all the physical blocks in the rewriteable non-volatile memory module 106 during the pre-formatting operation, and identifies one or more error correctable physical blocks and accordingly maintains the error information table. That is, the memory management circuit 1043 records the mapping relationship of the one or more error correctable physical blocks and the corresponding error bit number in the error information table.

Thereafter, as in step S720, after the memory storage device 100 leaves the factory, the memory management circuit 1043 executes a data write operation and a data read operation to all the physical blocks in the rewriteable non-volatile memory module 106, and consequently identifies one or more error correctable physical blocks among the aforementioned physical blocks and accordingly maintains the error information table. To be specific, the memory management circuit 1043 finds the physical block having error bit number, generated by the data read operation, smaller than or equal to a threshold among the physical blocks and identifies such as error correctable physical block. Moreover, the memory management circuit 1043 records the mapping relationship of the one or more error correctable physical blocks and the corresponding error bit number in the error information table.

Then, as in step S730, the memory management circuit 1043 selects a physical block for writing data according to the one or more error correctable physical blocks and the corresponding error bit number in the error information table. Also, referring to step S740, the memory management circuit 1043 dynamically updates the error information table according to the change of the error bit number of the one or more error correctable physical blocks.

In summary, in the present invention, the block management method, the memory controller and the memory storage device maintain an error information table to record corresponding error bit number of each error correctable physical block, and determine which error correctable physical block to write data according to the error bit number of each of the error correctable physical blocks. Managing physical blocks using the aforementioned method may not only average the lifespan of each physical block in the rewriteable non-volatile memory module, but also increase the data stability in the memory storage device. It should be noted that the advantages aforementioned not required in all versions of the invention.

Although the invention has been described with reference to the embodiments above, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A block management method for managing a plurality of physical blocks of a rewritable non-volatile memory module, the block management method comprising:

recording a plurality of error correctable physical blocks among the physical blocks and an error bit number corresponding to each of the error correctable physical blocks;

distributing the error correctable physical blocks to a plurality of groups according to the error bit number corresponding to each of the error correctable physical blocks;

selecting one of the groups of the rewritable non-volatile memory module; and selecting a physical block from the selected group for writing data.

2. The block management method according to claim 1, wherein the step of recording the error correctable physical blocks and the error bit number corresponding to each of the error correctable physical blocks comprises:

executing a writing test, an erasing test, and a reading test to the physical blocks;

identifying the error correctable physical blocks among the physical blocks, wherein the error correctable physical blocks are physical blocks that pass the writing test and the erasing test and having the error bit number, generated by the reading test, smaller than or equal to a threshold; and recording a mapping relationship of the error correctable physical blocks and the error bit numbers corresponding thereof in an error information table.

3. The block management method according to claim 2, wherein after the step of executing the writing test, the erasing test, and the reading test to the physical blocks, the block management method further comprises:

identifying at least one error uncorrectable physical block among the physical blocks, wherein the at least one error uncorrectable physical block is a physical block that does not pass the writing test and/or the erasing test, or a physical block that passes the writing test and the erasing test but the error bit number corresponding thereof is larger than the threshold; and recording the at least one error uncorrectable physical block in the error information table.

4. The block management method according to claim 1, wherein the step of recording the error correctable physical blocks among the physical blocks and the error bit number corresponding to each of the error correctable physical blocks comprises:

executing a data write operation and a data read operation to the physical blocks;

identifying the error correctable physical blocks among the physical blocks, wherein the error correctable physical blocks are physical blocks having the error bit number, generated by the data read operation, smaller than or equal to a threshold; and recording a mapping relationship of the error correctable physical blocks and the error bit numbers corresponding thereof in an error information table.

5. The block management method according to claim 1, wherein the step of recording the error correctable physical blocks among the physical blocks and the error bit number corresponding to each of the error correctable physical blocks comprises:

dynamically updating an error information table according to a change of the error bit numbers corresponding to the error correctable physical blocks while using the rewritable non-volatile memory module.

6. The block management method according to claim 1, wherein the groups comprise a plurality of block queues, each of the block queues corresponds to a block utility rate, and the step of selecting one of the groups comprises:

when data are about to be written to the rewritable non-volatile memory module, selecting one of the block queues for writing according to the block utility rate of each of the block queues.

7. The block management method according to claim 6, wherein the step of distributing the error correctable physical blocks to the groups further comprises:

among the error correctable physical blocks, distributing only the error correctable physical block having the error bit number smaller than or equal to a predetermined value to the block queues.

8. The block management method according to claim 6, further comprising:

determining whether to join an used physical block to the block queues after the used physical block is erased, according to an error information table.

9. The block management method according to claim 1, wherein the error bit number corresponding to each of the error correctable physical blocks is smaller than or equal to a threshold.

10. A memory controller for managing a rewritable non-volatile memory module in a memory storage device, the memory controller comprising:

a host system interface configured to be coupled to a host system;

a memory interface configured to be coupled to the rewritable non-volatile memory module, wherein the rewritable non-volatile memory module comprises a plurality of physical blocks; and a memory management circuit coupled to the host system interface and the memory interface and configured to record a plurality of error correctable physical blocks among the physical blocks and an error bit number corresponding to each of the error correctable physical blocks, distribute the error correctable physical blocks to a plurality of groups according to the error bit number corresponding to each of the error correctable physical blocks, select one of the groups of the rewritable non-volatile memory module, and select a physical block from the selected group for writing data.

11. The memory controller according to claim 10, wherein the memory management circuit executes a data write operation and a data read operation to the physical blocks, and identifies the error correctable physical blocks among the physical blocks, and record a mapping relationship of the error correctable physical blocks and the error bit numbers corresponding thereof in an error information table, wherein the error correctable physical blocks are physical blocks having the error bit number, generated by the data read operation, smaller than or equal to a threshold.

12. The memory controller according to claim 10, wherein while using the rewritable non-volatile memory module, the memory management circuit dynamically updates an error information table according to a change of the error bit numbers corresponding to the error correctable physical blocks.

13. The memory controller according to claim 10, wherein the groups comprise a plurality of block queues, each of the block queues corresponds to a block utility rate, wherein when data are about to be written to the rewritable non-volatile memory module, the memory management circuit selects one of the block queues for writing according to the block utility rate of each of the block queues.

14. The memory controller according to claim 13, wherein the memory management circuit distributes only the error correctable physical block having the error bit number smaller than or equal to a predetermined value to the block queues.

15. The memory controller according to claim 13, wherein the memory management circuit determines whether a used physical blocks is to join the block queues after the used physical block is erased, according to an error information table.

16. The memory controller according to claim 10, wherein the error bit number corresponding to each of the error correctable physical block is smaller than or equal to a threshold.

17. A memory storage device, comprising:
- a rewritable non-volatile memory module having a plurality of physical blocks;
- a connector, configured to be coupled to a host system; and
- a memory controller coupled to the rewritable non-volatile memory module and the connector and configured to record a plurality of error correctable physical blocks among the physical blocks and an error bit number corresponding to each of the error correctable physical blocks, distribute the error correctable physical blocks to a plurality of groups according to the error bit number corresponding to each of the error correctable physical blocks, select one of the groups of the rewritable non-volatile memory module, and select a physical block from the selected group for writing data.

18. The memory storage device according to claim 17, wherein the memory controller executes a data write operation and a data read operation to the physical blocks, and identifies the error correctable physical blocks among the physical blocks, and record a mapping relationship of the error correctable physical blocks and the error bit numbers corresponding thereof in an error information table, wherein the error correctable physical blocks are physical blocks having the error bit number, generated by the data read operation, smaller than or equal to a threshold.

19. The memory storage device according to claim 17, wherein while using the rewritable non-volatile memory module, the memory controller dynamically updates an error information table according to a change of the error bit numbers corresponding to the error correctable physical blocks.

20. The memory storage device according to claim 17, wherein the groups comprise a plurality of block queues, each of the block queues corresponds to a block utility rate,
wherein when data are about to be written to the rewritable non-volatile memory module, the memory controller selects one of the block queues for writing according to the block utility rate of each of the block queues.

21. The memory storage device according to claim 20, wherein the memory controller distributes only the error correctable physical block having the error bit number smaller than or equal to a predetermined value to the block queues.

22. The memory storage device according to claim 20, wherein the memory controller determines whether a used physical blocks is to join the block queues after the used physical block is erased, according to an error information table.

23. The memory storage device according to claim 17, wherein the error bit number corresponding to each of the error correctable physical blocks is smaller than or equal to a threshold.

* * * * *